US012674850B2

(12) United States Patent
Jain et al.

(10) Patent No.: US 12,674,850 B2
(45) Date of Patent: **\*Jul. 7, 2026**

(54) SYSTEM AND METHOD FOR FAST MAGNETOMETER CALIBRATION USING GYROSCOPE

(71) Applicant: STMICROELECTRONICS, INC., Coppell, TX (US)

(72) Inventors: Mahaveer Jain, Milpitas, CA (US); Mahesh Chowdhary, San Jose, CA (US)

(73) Assignee: STMICROELECTRONICS, INC., Coppell, TX (US)

( * ) Notice: Subject to any disclaimer, the term of this patent is extended or adjusted under 35 U.S.C. 154(b) by 273 days.

This patent is subject to a terminal disclaimer.

(21) Appl. No.: 18/488,750

(22) Filed: Oct. 17, 2023

(65) Prior Publication Data

US 2024/0045001 A1       Feb. 8, 2024

Related U.S. Application Data

(63) Continuation of application No. 17/135,628, filed on Dec. 28, 2020, now Pat. No. 11,815,568.

(51) Int. Cl.
G01R 33/00 (2006.01)
G01C 25/00 (2006.01)

(52) U.S. Cl.
CPC ....... G01R 33/0035 (2013.01); G01C 25/005 (2013.01)

(58) Field of Classification Search
CPC .. G01C 17/38; G01C 21/1654; G01C 25/005; G01R 33/0035; G01R 1/00; G01R 3/00;
(Continued)

(56) References Cited

U.S. PATENT DOCUMENTS 7,930,148 B1     4/2011   Figaro et al.
8,577,637 B2    11/2013   Vogt
(Continued)

FOREIGN PATENT DOCUMENTS

CN      101156120 A     4/2008
CN      102353917 A     2/2012
(Continued)

OTHER PUBLICATIONS

Cai et al., "Nine-axis inertial fusion method based on dynamic magnetic field calibration", Optics and Precision Engineering, vol. 28, No. 9, Sep. 2020, 10 pages.
(Continued)

*Primary Examiner* — Judy Nguyen
*Assistant Examiner* — Brent J Andrews
(74) *Attorney, Agent, or Firm* — Seed Intellectual Property Law Group LLP

(57)     ABSTRACT

An electronic device includes a magnetometer that outputs magnetometer sensor signals and a gyroscope that outputs gyroscope sensor signals. The electronic device includes a magnetometer calibration module that calibrates the magnetometer utilizing the gyroscope sensor signals. The electronic device generates a first magnetometer calibration parameter based on a Kalman filter process. The electronic device generates a second magnetometer calibration parameter based on a least squares estimation process.

20 Claims, 6 Drawing Sheets

(58) Field of Classification Search
CPC ... G01R 5/00; G01R 7/00; G01R 9/00; G01R
11/00; G01R 13/00; G01R 15/00; G01R
17/00; G01R 19/00; G01R 21/00; G01R
22/00; G01R 23/00; G01R 25/00; G01R
27/00; G01R 29/00; G01R 31/00; G01R
33/00; G01R 35/00
See application file for complete search history.

(56) References Cited

U.S. PATENT DOCUMENTS

| | | | |
|---|---|---|---|
| 8,577,640 | B2 | 11/2013 | Keal |
| 9,151,610 | B2 | 10/2015 | Chow et al. |
| 9,229,084 | B2 | 1/2016 | Tu |
| 9,534,924 | B2 | 1/2017 | Ahuja et al. |
| 10,444,030 | B1 | 10/2019 | Bogatsky et al. |
| 10,502,576 | B2 | 12/2019 | Trigoni et al. |
| 2008/0208527 | A1 | 8/2008 | Kavaklioglu |
| 2011/0301897 | A1 | 12/2011 | Weiss et al. |
| 2011/0301904 | A1 | 12/2011 | Bartholomeyczik et al. |
| 2012/0086438 | A1 | 4/2012 | Tu |
| 2012/0101766 | A1 | 4/2012 | Snow et al. |
| 2012/0217958 | A1 | 8/2012 | Oka et al. |
| 2014/0361763 | A1* | 12/2014 | Chow .................... G01R 33/02 324/202 |
| 2015/0019159 | A1* | 1/2015 | Elgersma ........... G01R 33/0035 702/94 |
| 2015/0177020 | A1 | 6/2015 | An et al. |
| 2015/0241390 | A1 | 8/2015 | Figaro |
| 2015/0354980 | A1 | 12/2015 | Wahdan et al. |
| 2017/0059667 | A1 | 3/2017 | Bassoli et al. |
| 2017/0176546 | A1 | 6/2017 | Jain et al. |
| 2017/0211936 | A1 | 7/2017 | Howell et al. |
| 2019/0250218 | A1 | 8/2019 | Anfiteatro et al. |
| 2020/0233043 | A1 | 7/2020 | Caplinger |
| 2021/0095966 | A1 | 4/2021 | Li et al. |
| 2022/0206085 | A1 | 6/2022 | Jain et al. |
| 2022/0413081 | A1 | 12/2022 | Mahfouz |

FOREIGN PATENT DOCUMENTS

| | | | |
|---|---|---|---|
| CN | 104296776 | A | 1/2015 |
| CN | 104865539 | A | 8/2015 |
| CN | 104884902 | A | 9/2015 |
| CN | 106033131 | A | 10/2016 |
| CN | 106660573 | A | 5/2017 |
| CN | 106660576 | A | 5/2017 |
| CN | 107003144 | A | 8/2017 |
| CN | 110779553 | A | 2/2020 |
| WO | 2014134710 | A1 | 9/2014 |
| WO | 2016150312 | A1 | 9/2016 |

OTHER PUBLICATIONS

Fang et al., "Design and implementation of MAV attitude estimation system", Journal of Electronic Measurement and Instrumentation, vol. 31, No. 3, Mar. 2017, 7 pages.
Fang et al., "A Novel Calibration Method of Magnetic Compass Based on Ellipsoid Fitting," IEEE Transactions on Instrumentation and Measurement, vol. 60, No. 6, Jun. 2011, pp. 2053-2061.
Mirko, "How to calibrate a 2D magnetometer with ellipsoid fitting," URL: <<https://www.mirosertic.de/blog/2023/01/magnetometer-calibration-ellipsoid/>> last retrieved Jun. 25, 2025, 4 pages.
Olivares et al., "Automatic Determination of Validity of Input Data Used in Ellipsoid Fitting MARG Calibration Algorithms," Sensors 13(9): 11797-11817, Sep. 2013. [21 pages].
Vitali, STMicroelectronics, DT0103 Design Tip, "Compensating for magnetometer installation error and hard-iron effects using accelerometer-assisted 2D calibration," Aug. 2018, Rev 1, 12 pgs.
Vitali, STMicroelectronics, DT0059 Design Tip, "Ellipsoid or sphere fitting for sensor calibration," Oct. 2018, Rev 3, 8 pages.
Wu et al., "Magnetometer and Gyroscope Calibration Method with Level Rotation," Sensors 2018, 18, 748; 16 pages, doi:10.3390/s1803078.
Troni et al., "Field Sensor Bias Calibration With Angular-Rate Sensors: Theory and Experimental Evaluation With Application to Magnetometer Calibration," IEEE/ASME Transactions on Mechatronics, vol. 24, No. 4, Aug. 2019, pp. 1698-1710.
Zhang, "Two-Step Calibration Methods for Miniature Inertial and Magnetic Sensor Units," IEEE Transactions on Industrial Electronics, Vo.. 62, No. 6, Jun. 2015, pp. 3714-3723.
Wu et al., "An improved magnetometer calibration and compensation method based on Levenberg-Marquardt algorithm for multi-rotor unmanned aerial vehicle," Measurement and Control 2020, vol. 53(3-4), pp. 276-286.

\* cited by examiner

*600*

*109*

*700*

*109*

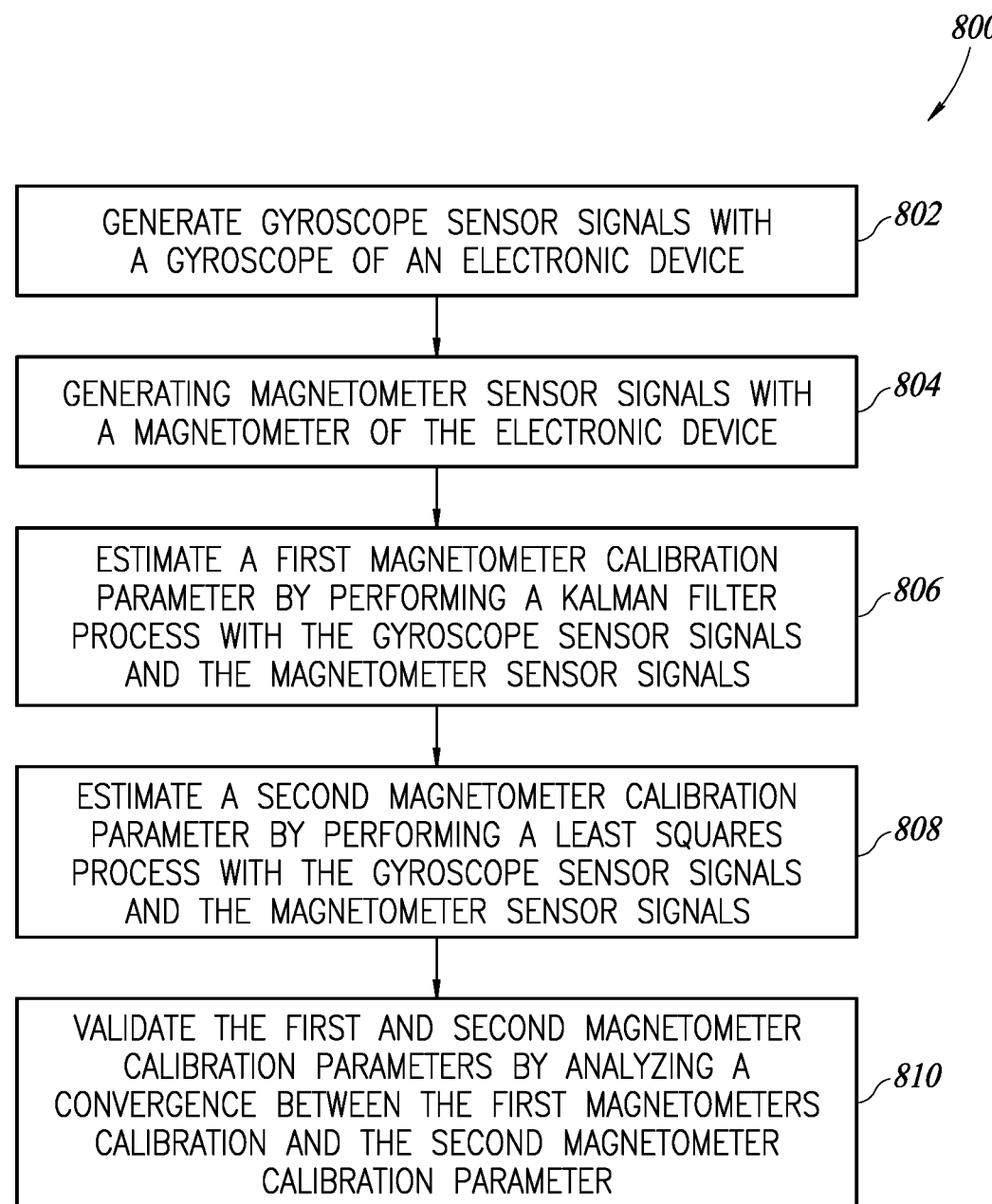

*800*

GENERATE GYROSCOPE SENSOR SIGNALS WITH A GYROSCOPE OF AN ELECTRONIC DEVICE — *802*

GENERATING MAGNETOMETER SENSOR SIGNALS WITH A MAGNETOMETER OF THE ELECTRONIC DEVICE — *804*

ESTIMATE A FIRST MAGNETOMETER CALIBRATION PARAMETER BY PERFORMING A KALMAN FILTER PROCESS WITH THE GYROSCOPE SENSOR SIGNALS AND THE MAGNETOMETER SENSOR SIGNALS — *806*

ESTIMATE A SECOND MAGNETOMETER CALIBRATION PARAMETER BY PERFORMING A LEAST SQUARES PROCESS WITH THE GYROSCOPE SENSOR SIGNALS AND THE MAGNETOMETER SENSOR SIGNALS — *808*

VALIDATE THE FIRST AND SECOND MAGNETOMETER CALIBRATION PARAMETERS BY ANALYZING A CONVERGENCE BETWEEN THE FIRST MAGNETOMETERS CALIBRATION AND THE SECOND MAGNETOMETER CALIBRATION PARAMETER — *810*

FIG. 8

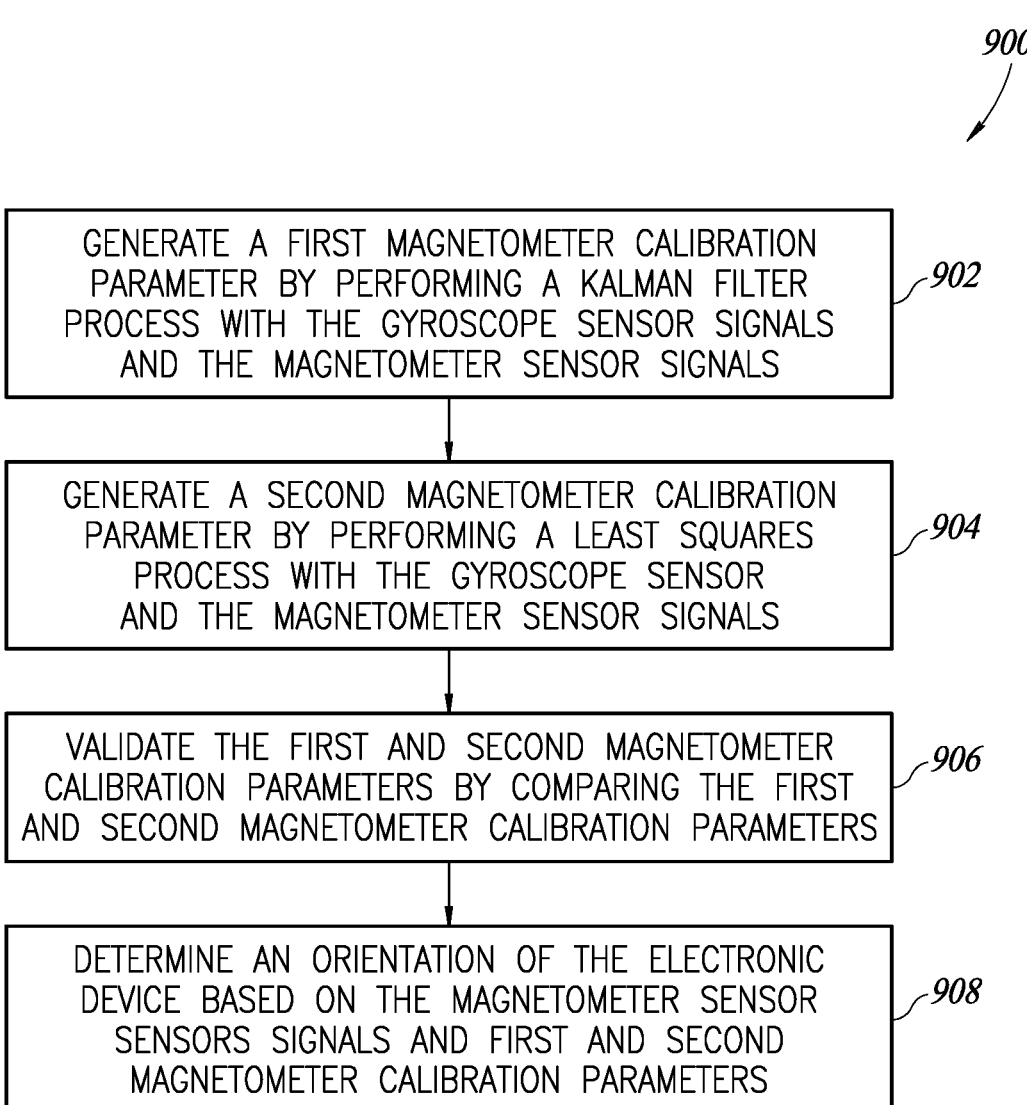

*900*

GENERATE A FIRST MAGNETOMETER CALIBRATION PARAMETER BY PERFORMING A KALMAN FILTER PROCESS WITH THE GYROSCOPE SENSOR SIGNALS AND THE MAGNETOMETER SENSOR SIGNALS — *902*

GENERATE A SECOND MAGNETOMETER CALIBRATION PARAMETER BY PERFORMING A LEAST SQUARES PROCESS WITH THE GYROSCOPE SENSOR AND THE MAGNETOMETER SENSOR SIGNALS — *904*

VALIDATE THE FIRST AND SECOND MAGNETOMETER CALIBRATION PARAMETERS BY COMPARING THE FIRST AND SECOND MAGNETOMETER CALIBRATION PARAMETERS — *906*

DETERMINE AN ORIENTATION OF THE ELECTRONIC DEVICE BASED ON THE MAGNETOMETER SENSOR SENSORS SIGNALS AND FIRST AND SECOND MAGNETOMETER CALIBRATION PARAMETERS — *908*

FIG. 9

SYSTEM AND METHOD FOR FAST MAGNETOMETER CALIBRATION USING GYROSCOPE

BACKGROUND

Technical Field

The present disclosure is related to electronic devices that include magnetometers and, more particularly, to systems and methods for calibrating magnetometers in electronic devices.

Description of the Related Art

Many types of electronic devices utilize sensors to determine the position and orientation of the electronic device. For example, smart phones, smart watches, navigation devices, augmented reality/virtual reality glasses, electronic compasses in automobiles and other types of electronic devices utilize sensors to determine the position and orientation of the electronic devices.

GPS systems are very useful for determining the position of an electronic device on the earth. However, GPS systems typically are not able to determine the orientation or heading of an electronic device. Electronic devices typically utilize magnetometers to assist in determining the orientation or heading of the electronic device. Magnetometers determine the orientation of the electronic device relative to the Earth's magnetic field. However, if there are other sources of magnetic field near the electronic device, then the magnetometer may provide a faulty orientation or heading.

BRIEF SUMMARY

Principles of the present disclosure provide an electronic device with a sensor module that is able to quickly and accurately calibrate a magnetometer of the sensor module. The calibration process utilizes multiple individual calibration techniques to calibrate the magnetometer. Each of the calibration techniques utilizes gyroscope sensor signals and magnetometer sensor signals to calibrate the magnetometer. The multiple calibration techniques are able to reinforce each other to ensure that the calibration is accurate.

In some embodiments, the sensor module utilizes both a Kalman filter process and a least-squares process to calibrate the magnetometer. The Kalman filter calibration process and the least squares calibration process utilize both gyroscope sensor signals and magnetometer sensor signals to generate calibration parameters that help filter out sources of magnetic field other than the Earth's magnetic field. The calibration parameters generated by the Kalman filter and the least-squares process are checked against each other to ensure that the calibration parameters found by the two processes align with each other.

The sensor module performs the calibration process with little or no disturbance to the user of the electronic device. In some cases, the user may make a few simple gestures to aid in the calibration process. In other cases, the sensor module can perform the calibration process without directing the user to make any additional movements. The result is a calibration process that is effective, efficient, and unobtrusive.

BRIEF DESCRIPTION OF THE SEVERAL VIEWS OF THE DRAWINGS

FIG. 8 is a flow diagram of a process for operating an electronic device, according to one embodiment.

FIG. 9 is a flow diagram of a process for operating an electronic device, according to one embodiment.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known aspects of electronic devices and sensor modules have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
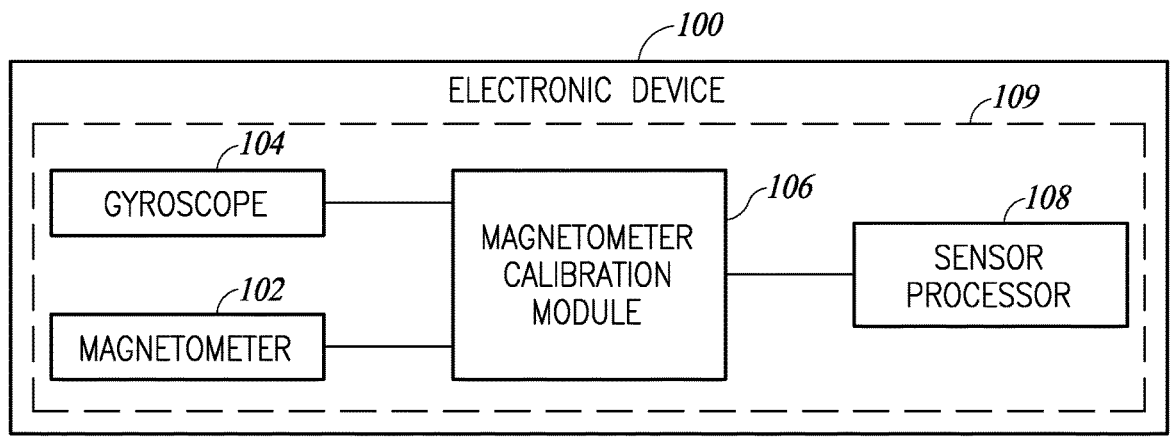
FIG. 1 is a block diagram of an electronic device, according to one embodiment.

FIG. 1 is a block diagram of an electronic device 100, according to one embodiment. The electronic device 100 includes a magnetometer 102 and a gyroscope 104. As will be set forth in more detail below, the electronic device 100 utilizes signals from both the magnetometer 102 and the gyroscope 104 in order to calibrate the magnetometer 102. Furthermore, the electronic device 100 utilizes both a Kalman filter calibration process and a least-squares calibration process, independent of each other, to calibrate the magnetometer 102.

The electronic device 100 utilizes various sensors to determine position in a global reference frame, state of motion, orientation, and heading. The electronic device 100 can include one or more of a smartphone, a navigation device, a smartwatch, an augmented reality (AR)/virtual reality (VR) headset, an electronic compass in the rear-view mirror of an automobile, or other types of electronic devices.

The magnetometer 102 senses magnetic fields in the vicinity of the electronic device 100. The magnetometer 102 outputs magnetic sensor signals indicating the strength and direction of the magnetic field at the location of the electronic device 100. The electronic device 100 can utilize the magnetic sensor signals to assist in determining the heading of the electronic device 100. The heading corresponds to the current orientation of the electronic device 100. In an example in which the electronic device 100 is an AR/VR headset, the heading can indicate the direction that the headset is facing. If a user is wearing the headset, the heading indicates the direction that the user is looking.

The magnetometer 102 can include a multiaxis magnetometer. The multiaxis magnetometer 102 senses the magnitude of the magnetic field in each of the multiple axes. The magnetic sensor signals can include magnetic field strength values sensed on each of the multiple axes. In one example, the multiaxis magnetometer 102 is a three axis magnetometer. The axes are mutually orthogonal with each other and can be labeled X, Y, and Z axes. The relative orientations of the axes can be based on the orientation of the magnetometer 102 within the electronic device 100. The magnetometer 102 can be a magnetoresistive sensor, a solid-state Hall effect sensor, an inductive coil based sensor, or other type of magnetic sensors.

The electronic device 100 determines the heading based, in large part, on the Earth's magnetic field. The Earth's magnetic field is relatively constant in both magnitude and direction for a given latitude and longitude on the Earth's surface. Accordingly, the strength and direction of the magnetic field sensed by the magnetometer can give a strong indication of the orientation of the electronic device 100 relative to the Earth's magnetic field.

However, the electronic device 100 may be in the presence of other magnetic fields in addition to the Earth's magnetic field. For example, the electronic device 100 may be near a permanent magnet, an electromagnet, or other sources of magnetic fields. The presence of these other magnetic fields can obscure the Earth's magnetic field. If the other magnetic fields are not accounted for, then the electronic device 100 may generate erroneous heading estimations. This can result in poor function of the electronic device 100 and a frustrating experience for the user.

In order to account for the presence of magnetic fields other than the Earth's magnetic field, the electronic device 100 includes a magnetometer calibration module 106. The magnetometer calibration module 106 receives magnetic sensor signals from the magnetometer 102 and generates one or more calibration parameters. The calibration parameters can include a hard iron offset parameter. The hard iron offset indicates the magnitude and direction of constant magnetic fields other than the Earth's magnetic field. The magnetometer calibration module 106 utilizes the hard iron offset parameter, or other calibration parameters, to filter out other magnetic fields or to otherwise isolate the Earth's magnetic field in the magnetic sensor signals from the magnetometer 102.

Traditional calibration processes have asked that the user of an electronic device wave the electronic device with large sweeping motions in complex patterns in order to calibrate a magnetometer. Such motion is used to expose all axes of magnetometer to primary component of Earth's magnetic field vector. For example, traditional calibration processes may ask the user to move the electronic device in a large FIG. 8 pattern. The traditional calibration processes may then ask users to repeatedly tilt the electronic device back and forth along multiple axes. This can be inconvenient and obtrusive to the user. This inconvenience is magnified for devices that are worn on the user as it is more difficult to move such devices in complex sweeping and tilting motions.

The electronic device 100 in accordance with principles of the present disclosure provides a calibration process that is far less intrusive to the user than are traditional calibration processes. For example, the magnetometer calibration process in accordance with principles of the present disclosure can be performed with little or no movement asked of the user. This is because the magnetometer calibration module 106 utilizes signals from both the magnetometer 102 and the gyroscope 104 during the calibration process. Furthermore, the magnetometer calibration module 106 determines a magnetometer calibration parameter with multiple independent methods and then checks the outcomes of these methods along with other conditions to determine whether the magnetometer calibration module 106 has correctly calibrated the magnetometer 102. Because the magnetometer calibration module 106 utilizes multiple types of sensor signals and multiple independent calibration processes to determine calibration parameters, little or no additional motion may be asked of the user in order to calibrate the magnetometer 102.

The gyroscope 104 senses angular rotational motion of the electronic device 100. The gyroscope 104 generates gyroscope sensor signals indicating the rate of angular motion (i.e., rotation motion) of the electronic device 100. The gyroscope 104 provides the gyroscope sensor signals to the magnetometer calibration module 106. The magnetometer calibration module 106 utilizes the gyroscope sensor signals and the magnetometer sensor signals in order to calibrate the magnetometer 102.

The gyroscope 104 can be a multi-axis gyroscope. In this case, the gyroscope 104 senses angular motion around each of multiple axes. In one example, the gyroscope 104 is a three axis gyroscope that senses angular motion around each of three axes. The three axes are mutually orthogonal and can be labeled X, Y, and Z axes. The X, Y, and Z axes are defined in relation to the layout of the gyroscope 104 within the electronic device 100. The X, Y, and Z axes of the gyroscope 104 may correspond to the X, Y, and Z axes of the magnetometer 102 such that the angular motion rate for each axis can be paired with the magnetic field value for that axis during calibration of the magnetometer 102.

The gyroscope 104 can be a microelectromechanical system (MEMS). In this case, the gyroscope 104 may be implemented in a silicon-based substrate with structures and components that result in the generation of electrical signals indicative of the angular motion sensed on one or more axes. The MEMS gyroscope 104 can include capacitive sensing configurations, piezoelectric sensing configurations, piezoresistive sensing configurations, or other types of sensing configurations.

The magnetometer calibration module 106 utilizes a first calibration process and a second calibration process. Each of the first and second calibration processes utilize both the magnetic sensor signals and the gyroscope sensor signals. Each of the first and second calibration processes generates one or more calibration parameters. The calibration parameter or parameters from each process can be validated by comparing them to the calibration parameter or parameters from the other process. If the independently generated calibration parameters match each other, then this is an indication that the calibration parameter or parameters are correct and that the magnetometer 102 is properly calibrated. If the independently generated calibration parameter or parameters do not match each other, then this is an indication that the magnetometer 102 may not yet properly calibrated.

In one embodiment, the first calibration method is a Kalman filter method. The Kalman filter method generates a hard iron offset estimation by propagating magnetometer using gyroscope sensor values and minimizing the error with a constraint on individual components and the total magnetic field. The Kalman filter takes a plurality of sets of magnetometer and gyroscope sensor values. Each set of values corresponds to a particular point in time. In one example, each set of values includes the X, Y, and Z values from the magnetometer and the gyroscope at a given time. The Kalman filter process includes a linear quadratic estimation algorithm that uses the sets of magnetometer and angular motion sensor values to estimate the hard iron offset. The magnetometer and angular motion sensor values include statistical noise and other inaccuracies. The Kalman filter process estimates the hard iron offset by estimating a joint probability distribution over the values for each timeframe. Additionally, or alternatively, the Kalman filter process can estimate calibration parameters other than the hard iron offset.

The second calibration method is a least-squares method. The least-squares method estimates the hard iron offset by minimizing an error between a first derivative of magnetic field and a gyroscope propagated magnetic field reading corrected by bias. The least squares method is a regression analysis technique. The least-squares method utilizes both the magnetic sensor signal values in the gyroscope sensor signal values to make an estimate of the hard iron offset. Additionally, or alternatively, the least-squares method can estimate one or more calibration parameters other than a hard iron offset.

The magnetometer calibration module 106 utilizes a validation process to determine whether the hard iron offsets estimated by each calibration process are valid. The validation process checks convergence between the hard iron offset value generated by the Kalman filter and the hard iron offset value generated by the least-squares method. If the independently generated hard iron offset values converge, i.e. are the same, then the magnetometer calibration module 106 determines that the calibration parameters are valid. In one example, the magnetometer calibration module 106 checks to see whether the difference between the hard iron offset values generated by the two processes is less than a threshold value. If the difference is less than the threshold value, then the hard iron offset values are valid and the calibration process is complete. If the difference is greater than the threshold value, then the hard iron offsets are not valid and the calibration process is not complete.

In one embodiment, the magnetometer calibration module 106 continuously calibrates the magnetometer 102. In this case, the magnetometer calibration module 106 may estimate and validate the calibration parameter multiple times every second. Thus, as the electronic device is moved about 100 by a user, the calibration process is repeated frequently so that the magnetometer 102 is calibrate at earliest or updated with latest calibration parameters, thereby helping to ensure that the heading orientation of the electronic device 100 is accurate moment by moment. Alternatively, the calibration process may be performed only once every few hours or even days.

The magnetometer calibration module 106 may correspond to software blocks, hardware blocks, or combinations of software and hardware blocks. The Kalman filter and the least-squares processes may correspond to software processes that perform analyses, calculations, or estimations based on the magnetometer sensor signals and the gyroscope sensor signals. The magnetometer calibration module 106 may also include one or more memories for storing software instructions, sensor signal values, calibration parameter values, and other data. The magnetometer calibration module 106 may also include one or more processors for executing the software instructions order to generate the calibration parameter values.

In one embodiment, the electronic device 100 includes a sensor processor 108. The sensor processor 108 receives the calibration parameters from the magnetometer calibration module 106. The sensor processor 108 may also receive the magnetometer sensor signals from the magnetometer 102 or from the magnetometer calibration module 106. The sensor processor 108 processes the magnetometer sensor signals in order to determine the heading or orientation of the electronic device 100. The sensor processor 108 may include one or more processors and one or more memories. The memories may store software instructions and other types of data related to the processing of sensor signals. The one or more processors may execute the software instructions. The sensor processor 108 and the magnetometer calibration module 106 may share memory and processing resources.

The magnetometer 102, the gyroscope 104, the magnetometer calibration module 106, and the sensor processor 108 are part of a sensor module 109 of the electronic device 100.

Figure 2:
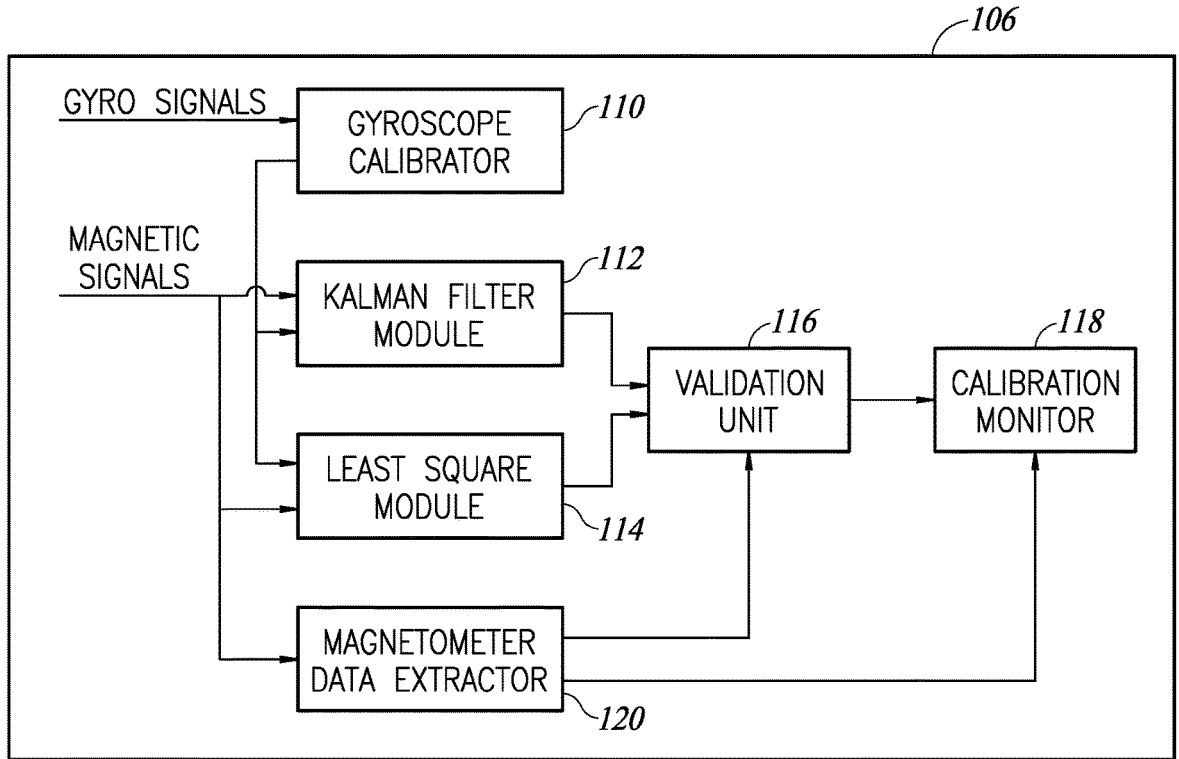
FIG. 2 is a block diagram of a magnetometer calibration module, according to one embodiment.

FIG. 2 is a block diagram of a magnetometer calibration module 106, according to one embodiment. The magnetometer calibration module 106 is one example of the magnetometer calibration module 106 of FIG. 1. The magnetometer calibration module 106 includes a gyroscope calibrator 110, a Kalman filter module 112, a least squares module 114, a validation unit 116, a calibration monitor 118, and a magnetometer data extractor 120.

The gyroscope calibrator 110 receives uncalibrated gyroscope sensor signals from the gyroscope 104 (see FIG. 1). The gyroscope calibrator 110 performs a calibration process to remove bias from the uncalibrated gyroscope sensor signals. The gyroscope calibrator 110 outputs calibrated gyroscope sensor signals.

The gyroscope calibrator 110 can compute variance about each axis, peak to peak value in a given time window, and average value. The gyroscope calibrator 110 can detect status conditions. The gyroscope calibrator 110 can identify if the device is stationary by checking if the variance about each axis is less than a threshold variance, if the average value is within an acceptable level of gyroscope bias, and if the predicted value is less than a threshold peak to peak value. If the calibration monitor 118 detects a static condition, the gyroscope calibrator 110 can output gyroscope calibration parameters as an average of previous values.

The Kalman filter module 112 receives as inputs, magnetic sensor signals from the magnetometer sensor 102 and calibrated gyroscope sensor signals from the gyroscope calibrator 110. Accordingly, in one embodiment, the Kalman filter module 112 does not receive the gyroscope signals directly from the gyroscope, but from the gyroscope calibrator 110. Because the Kalman filter module 112 utilizes gyroscope sensor signals to calibrate the magnetometer 102, it is beneficial to ensure that the gyroscope sensor signals are calibrated before being received by the Kalman filter module

112. The Kalman filter module 112 performs the Kalman filter process on the magnetic sensor signals and the gyroscope sensor signals. The Kalman filter module 112 outputs magnetometer calibration parameters. In one example, the magnetometer calibration parameters include a hard iron offset value.

For the Kalman filter process, a three-dimensional vector can be represented by the following equation:

$$v_n = R_b^n(t)v_b,$$

where $$R_b^n(t)$$

represents a rotation matrix and $v_b$ and $v_n$ represent vectors in respective frames. Similarly, a magnetic field measured by the magnetic sensor 102 can also be represented in a global frame in the following manner:

$$B_n = R_s^n(t)B_s,$$

where $B_n$ and $B_s$ are magnetic field strength values in respective axes of global frame and sensor frame. Due to bias in magnetic field measurements, the equation can be written as $$B_n = R_s^n(t)(B_s - HI),$$

where HI is the hard iron offset. Since magnetic field in global frame ($B_n$) is constant for a location, differentiating the previous equation generates the following:

$$0 = R_s^n(t)\delta B_s + \delta(R_s^n(t)) * (B_s - HI).$$

Rearranging the terms yields the following:

$$R_s^n(t)\delta B_s = -\delta(R_s^n(t)) * (B_s - HI).$$

The derivative of $$(R_s^n(t))$$

can also be represented in the following manner:

$$\delta(R_s^n(t)) = R_s^n(t)[\omega_t \times]$$

where $[\omega_t \times]$ is a skew matrix and $\omega_t$ is angular velocity. The equation becomes:

$$\delta B_s = -[\omega_t \times](B_s - HI).$$

Because the Earth's magnetic field is constant at a given location, the following relations can be utilized:

$$B_n^2 = \sum_{i=x,y,z}\left(B_s^i - HI^i\right)^2 \text{ and}$$

$$B_n^2 + \sum_{i=x,y,z}\left(HI^i\right)^2 = \sum_{i=x,y,z}\left(B_s^i\right)^2 - 2*B_s^i*HI^i.$$

Furthermore, $$B_n^2 + \sum_{i=x,y,z}\left(HI^i\right)^2$$

can be replaced with Rb. Since HI and $B_n$ are constant, Rb is also constant. The equations can be written in state propagation form $\dot{x}=Ax$:

$$\begin{bmatrix} \delta B_s \\ \delta HI \\ \delta R \end{bmatrix} = \begin{bmatrix} -[\omega_t \times] & [\omega_t \times] & 0 \\ 0 & 0 & 0 \\ 0 & 0 & 0 \end{bmatrix}\begin{bmatrix} B_s \\ HI \\ Rb \end{bmatrix}.$$

The measurements equation can be represented in the form $z=Hx$:

$$\begin{bmatrix} B_s \\ \sum_{i=x,y,z} B_s^i \end{bmatrix} = \begin{bmatrix} I_{3x3} & 0_{3x3} & 0 \\ 0_{1x3} & 2*B_s & 1 \end{bmatrix}\begin{bmatrix} \delta B_s \\ \delta HI \\ \delta Rb \end{bmatrix}.$$

The Kalman filter module 112 utilizes these concepts to estimate a hard iron offset, in one embodiment.

The Kalman filter approach is utilized to estimate the biases in total magnetic field strength by minimizing the root mean square error between measurements and prediction. This involves predicting a magnetic field vector by propagating with angular velocity, predicting bias and total magnetic field strength (Rb) values, and propagating an error covariance matrix (P). Measurement and correction steps involved include preparing the measurements (magnetometer readings in total magnitude to the field), preparing a noise measurement matrix (R), and estimating the Kalman filter gain (K) and correcting of the prediction using Kalman filter update equations.

The least-squares module 114 receives, as inputs, magnetic sensor signals from the magnetometer sensor 102 and calibrated gyroscope sensor signals from the gyroscope calibrator 110. The least-squares module 114 performs a least-squares process on the magnetic sensor signals and the gyroscope sensor signals. The least-squares module 114 outputs magnetometer calibration parameters. In one example, the magnetometer calibration parameters include a hard iron offset value.

When utilizing the least-squares method for estimating the hard iron offset, the following relationship can be used:

$$\delta B_s + [\omega_t \times](B_s - HI) = 0.$$

The following cost function can be used to estimate an optimum HI value to minimize the loss:

$$\gamma(HI) = \Sigma\|\delta B_s(t) + [\omega_t \times](B_s(t) - HI)\|.$$

Differentiating the above equation with respect to HI for optimum value leads to the following relationship:

$$\overline{H} = \left(\sum_{t=0}^{T}[\omega_t \times]^2\right)^{-1} * \left(\sum_{t=0}^{T}[\omega_t \times](\delta B_s(t) + [\omega_t \times]B_s)\right)$$

In this manner, the least-squares module 114 can be utilized to estimate a hard iron offset.

The magnetometer data extractor 120 receives the magnetic sensor signals from the magnetometer 102. The magnetometer data extractor 120 extracts unique data values from the magnetic sensor signals. For example, the magnetometer data extractor 120 extracts sensor signal values that are different from previous values. The magnetometer data extractor 120 analyzes each set of sensor signal values (each set including a value for each measurement axis of the magnetometer 102 at a given point in time). The magnetometer data extractor 120 identifies individual values or entire sets of values that are outside the range of recently received sensor signal values. The magnetometer data extractor 120 stores these values in a buffer. The unique values are then provided from the buffer to the validation unit, as will be described in more detail below.

It can be valuable to extract unique magnetic field points to assess the quality of calibration rather than relying on current data or an average of data. Averaging can provide equal weights to duplicate points or values. Accordingly, it can be beneficial to maintain only sparse points. Accordingly, the magnetometer data extractor 120 checks for unique samples in the current sensor data stream with respect to stored magnetometer data (i.e. previous magnetic sensor signal values) in order to get uniform and wide ranges of data samples. Unique samples are extracted by checking the difference between the most recent previously stored magnetic sensor signal values and new magnetic sensor signal values. This can include checking the Euclidean or Manhattan distance between new sensor signal values and all stored sensor signal values. If a new sample is unique it will be stored in the buffer. In one example, sensor signal values that are older than the threshold value are discarded and not used to identify unique values. In one example, the threshold time value is between 10 seconds and 20 seconds, though other values can be utilized without departing from the scope of the present disclosure.

The validation unit 116 receives magnetometer calibration parameter values from the Kalman filter module 112, magnetometer calibration parameter values from the least-squares module 114, and unique magnetic sensor values from the magnetometer data extractor 120. The validation unit 116 validates the magnetometer calibration parameter values provided by the Kalman filter module 112 and the least-squares module 114.

The validation unit 116 checks the rotation span of each axis. In one example, it is desirable that at least two axes have a rotation of 75°. The validation unit checks the total rotation with the expectation that the total rotation will exceed 180°. The validation unit 116 checks the convergence of magnetometer calibration parameter values from both methods. If the distance between both bias vectors is higher than 2 µT, a validity flag is set to false and no calibration value will be output from the validation unit 116. In this example, 2 µT is a hard iron bias threshold value. For calibration validity, the difference between hard iron offset values should be less than or equal to 2 µT. Other threshold values can be utilized without departing from the scope of the present disclosure. If the values converge with a difference less than the threshold, then the validity flag is set to true and the validation unit 116 outputs the calibration parameter (e.g. hard iron bias).

The calibration monitor 118 is utilized to check the quality of calibration and to detect anomalies. The calibration monitor 118 receives, as input, the calibration parameter from the validation unit 116, if the validity flag is true. The calibration monitor 118 also receives the unique magnetic data points from the magnetometer data extractor 120. The calibration monitor 118 outputs a calibration quality status and updated calibration parameters. In one example, the calibration quality status can be either poor, passable, good, or unknown. Other types of statuses can be utilized without departing from the scope of the present disclosure.

The calibration monitor 118 updates the calibration status based on the elapsed time from the last calibration value and the deviation in the array of unique magnetic field values as extracted by the magnetometer data extractor 120. The threshold times for determining whether to downgrade quality can be different depending on the most recent status value. For example, an elapsed time of 10 to 15 hours can result in a downgrade from good quality passable quality. An elapsed time of one to three days can result in a downgrade from passable quality to poor quality. An elapsed time of 8 to 12 days can result in a downgrade from poor to unknown. Other threshold elapsed time thresholds can be utilized without departing from the scope of the present disclosure.

The calibration monitor 118 continuously monitors the total magnetic field deviation computed on unique magnetic data points and makes a judgment of calibration quality based on the mean value and the variation values. In one example, if the deviation is greater than a first threshold deviation, then the calibration quality is poor. If the deviation is greater than a second threshold deviation less than the first threshold deviation, then the calibration quality is passable. If the deviation is greater than a third threshold deviation less than the second threshold deviation, then the calibration quality is good.

In one embodiment, the magnetometer calibration module 106 can perform gyroscope calibration, magnetic calibration parameter estimation, unique magnetic value extraction, and validation between 50 and 200 times per second. Calibration quality monitoring may be performed at a much lower frequency. For example, calibration quality monitoring may be performed once per second. Other frequencies can be utilized without departing from the scope of the present disclosure.

Figure 3:
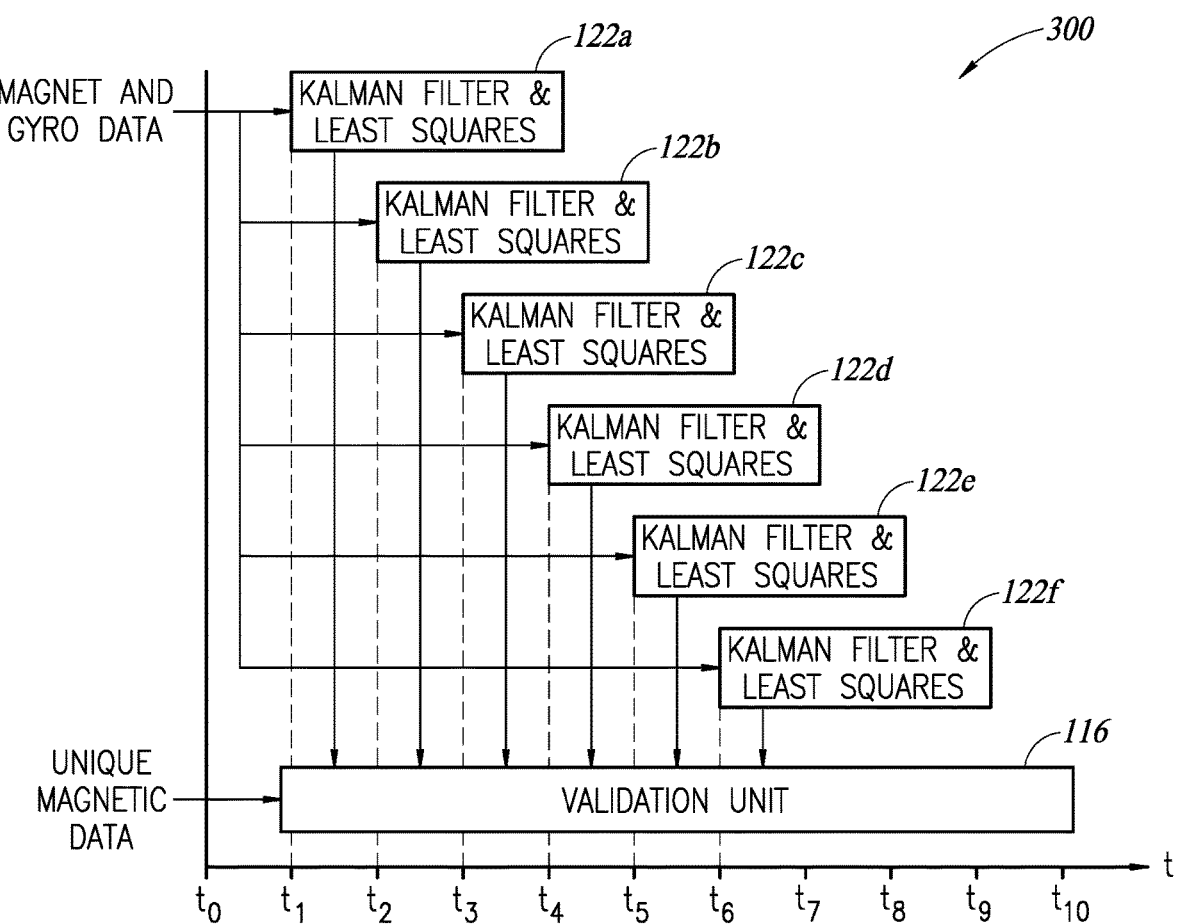
FIG. 3 is a timeline of multiple instances of Kalman filters and least-squares processes of a magnetometer calibration module, according to one embodiment.

FIG. 3 is a timeline 300 illustrating that multiple instances of Kalman filter and least squares process may be running simultaneously, according to one embodiment. With reference to FIG. 2 and FIG. 3, the Kalman filter module 112 may initiate multiple overlapping instances of a Kalman filter process. Likewise, the least-squares module 114 may initiate multiple overlapping instances of a least-squares process. In FIG. 3, the combined instances of a Kalman filter and a least squares process are labeled as 122a-122f. Each instance generates a calibration parameter from a Kalman filter process and a calibration parameter from a least-squares process. The validation unit 116 receives the calibration parameters from each of the instances 122a-122f.

At time T1 the first instance 122a of a Kalman filter and a least-squares process is initiated by the Kalman filter module 112 and the least-squares module 114. In practice, the Kalman filter module 112 and the least-squares module 114 may be implemented in a single module that generates each instance 122a of a Kalman filter and a least-squares process. At time T2 an instance 122b of a Kalman filter and a least-squares process is initiated while the instance 122a is still running. At time T3, an instance 122*c* of a Kalman filter and a least-squares process is initiated while the instances 122*a* and 122*b* are still running. At time T4, an instance 122*d* of a Kalman filter the least-squares process is initiated while the instances 122*a*-122*c* are still running. Between times T4 and T5, the instance 122*a* has completed generation of calibration parameters and has provided the calibration parameters to the validation unit 116. At time T5, an instance 122*e* of a Kalman filter and a least squares process is initiated while the instances 122*b*-122*d* are still running. Between times T5 and T6, the instance 122*b* has completed generation of calibration parameters and has provided the calibration parameters to the validation unit 116. At time T6, an instance 122*f* of a Kalman filter and a least-squares process is initiated while the instances 122*c*-122*e* are still running.

In FIG. 3, the downward pointing arrows indicate that the corresponding instance of a Kalman filter and a least-squares process has provided calibration parameters to the validation unit 116. However, the placement in time of the downward pointing arrows does not necessarily correspond to the actual time at which calibration parameters are provided to the validation unit 116. In practice, calibration parameters are provided from an instance of the Kalman filter and a least-squares process at the end of the Kalman filter and least squares process.

Each instance of a Kalman filter and a least-squares process estimates calibration parameters based on sets of values of the sensor signals across a particular window of time. The windows of time may overlap with other Kalman filter and least squares instances. Accordingly, some of the sets of values used by a Kalman filter and least squares process are used by other instances of Kalman filters and least-squares processes. The size of the window may be selected to balance between capturing the calibration motion and minimizing the probability of external magnetic interference.

The validation unit 116 may output a validity flag for each pair of calibration parameters provided from an instance of a Kalman filter and a least-squares process. Alternatively, the validation unit 116 may only output a validity flag after analyzing the calibration parameters from several instances of Kalman filters and least-squares processes.

Figure 4:
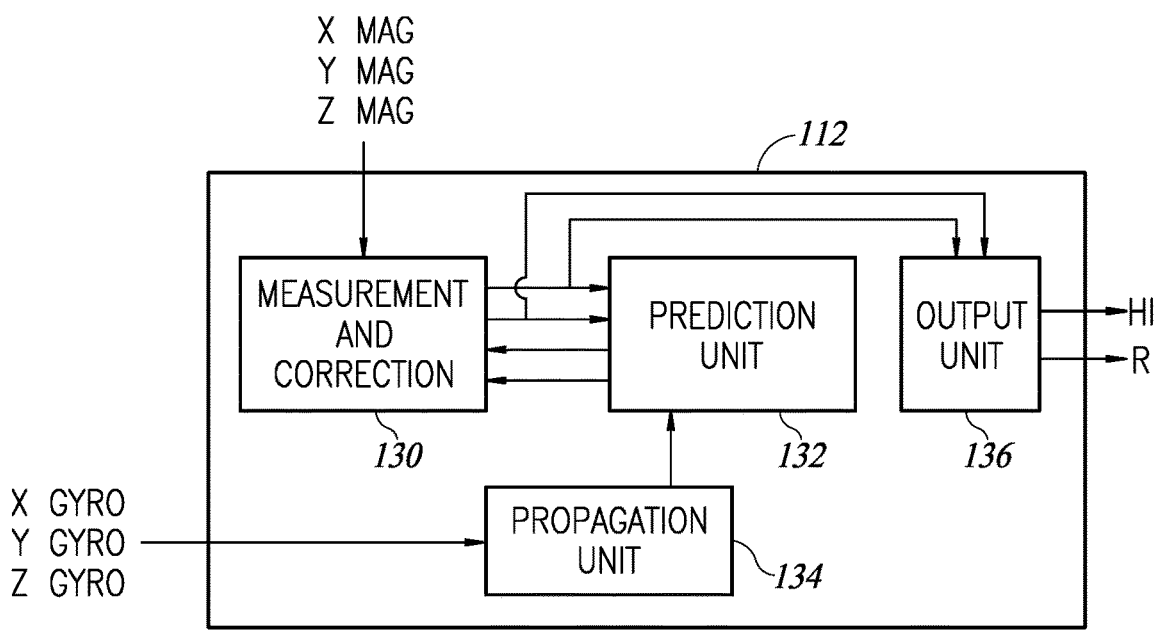
FIG. 4 is a block diagram of a Kalman filter module of a magnetometer calibration module, according to one embodiment.

FIG. 4 is a block diagram of a Kalman filter module 112, according to one embodiment. The Kalman filter module 112 of FIG. 4 is one example of a Kalman filter module 112 described in relation to FIGS. 1-3. The Kalman filter module 112 includes a measurement and correction unit 130, a prediction unit 132, and a propagation unit 134. The propagation unit 134 receives gyroscope sensor signals on all three gyroscope axes X, Y, and Z. The propagation unit propagates magnetic field and total strength values to the prediction unit 132 using angular velocity values from the gyroscope sensor signals. The prediction unit 132 receives the propagated magnetic field and total strength values from the propagation unit 134. The prediction unit predicts the bias and the noise matrix (R) and propagates the error covariance matrix (P). The measurement and correction unit 130 receives the magnetic sensor signals related to each sensing axis X, Y, and Z of the magnetometer 102. The measurement and correction unit 130 also receives the noise matrix and error covariance prediction values from the prediction unit 132. The measurement and correction unit 130 prepares a measurement of the noise matrix (R) and estimates the Kalman filter game (K) and corrects the predictions from the prediction unit 132 using Kalman filter update equations. The corrected values are provided to the prediction unit 132 and the output unit 136. The output unit 136 generates the hard iron offset/bias value and the noise matrix (R) and outputs them to the validation unit 116.

Figure 5:
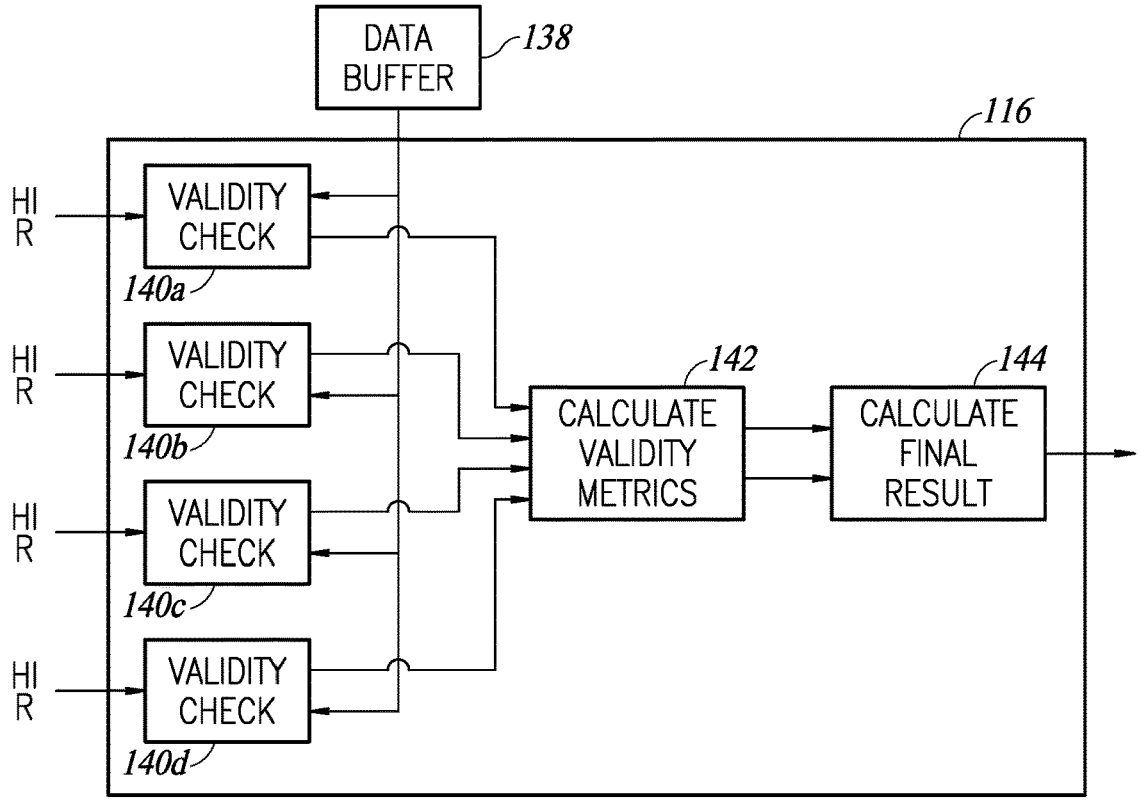
FIG. 5 is a block diagram of a validation unit of a magnetometer calibration module, according to one embodiment.

FIG. 5 is a block diagram of a validation unit 116, according to one embodiment. The validation unit 116 of FIG. 5 is one example of the validation unit as described in relation to FIG. 2. The validation unit is responsible for determining when to override or update calibration parameters. The inputs are the calibration parameters from the various Kalman filter and least squares instances and the magnetometer sensor values.

The validation unit 116 initiates, for each instance 122 of a Kalman filter and least squares process, a validity check process. Each validity check process receives unique magnetic sensor signal data from the data buffer 138. The data buffer 138 stores unique magnetic sensor signal values extracted by the magnetometer data extractor 120 of FIG. 2. Each validity check process 140*a*-140*d* receives hard iron offset values and a computed total magnetic field strength from a corresponding Kalman filter and least squares instance 122 (not shown). Each validity check process 140*a-d* checks if the validity flag is true and if the total magnetic field is within a valid range (e.g. 25-60 µT). Each validity check process 140*a-d* computes the total magnetic field and unique magnetic data points with calibration parameters, checks that the total deviation is not more than a threshold deviation (e.g. 5-7 µT) and that the average magnetic field is within a selected threshold (e.g. within 4-6 µT). If the calibration parameters meet these criteria, the calibration parameters have valid values and are passed to the calculated validity metrics process 142.

The calculated validity metrics process 142 is responsible to compute the appropriate weights to each valid calibration parameter. This can be performed by computing the total deviation from the true magnetic field. Lower deviations will get higher weights. The calculated validity metrics process 142 also checks consistency with other instances of calibration output. If calibration parameters are far from the rest of the calibration parameters, then zero weight will be assigned. If deviation with latest calibration parameters is lower than most recent successful calibration parameters, then weight will be increased.

The calculated final results process 144 computes the weighted sum of all valid calibration parameters from all instances. The output contains the current time, calibration parameters, and calibration quality based on deviation from true magnetic field. The calculated final results process 144 outputs the calibration parameters and the quality status.

Figure 6:
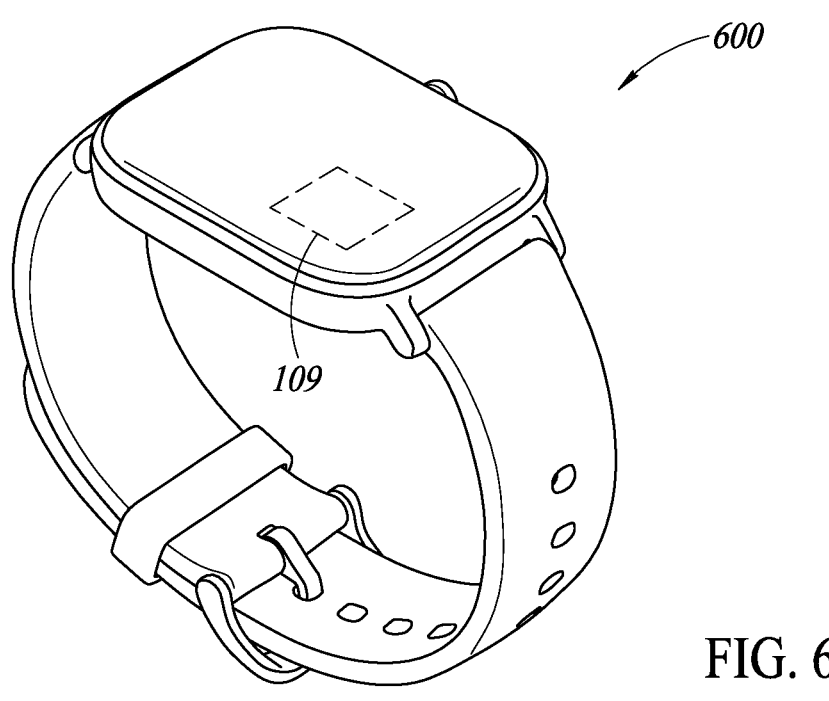
FIG. 6 is an illustration of a smartwatch including a sensor module, according to one embodiment.

FIG. 6 is an illustration of a smartwatch 600, according to one embodiment. The smartwatch 600 is one example of an electronic device 100 of FIG. 1. The smartwatch 600 includes a sensor module 109. The sensor module 109 includes the gyroscope 104, the magnetometer 102, the magnetometer calibration module 106, and a sensor processor 108 described in relation to FIG. 1. When calibration of the magnetometer 102 is to be performed, the smartwatch 600 may prompt a user to make some small motions with the wrist to which the smartwatch 600 is coupled. The smartwatch 600 may perform calibration as described previously based on gyroscope and magnetometer sensor signals generated during the prescribed motion. The prescribed motion is small compared to traditional methods due to the effectiveness of the calibration process as described herein. In some cases, the smartwatch 600 may perform calibration without requesting any movement at all. After calibration has been performed, the sensor processor 108 can calculate the heading orientation of the smartwatch 600 based on the magnetometer and gyroscope sensor signals.

Figure 7:
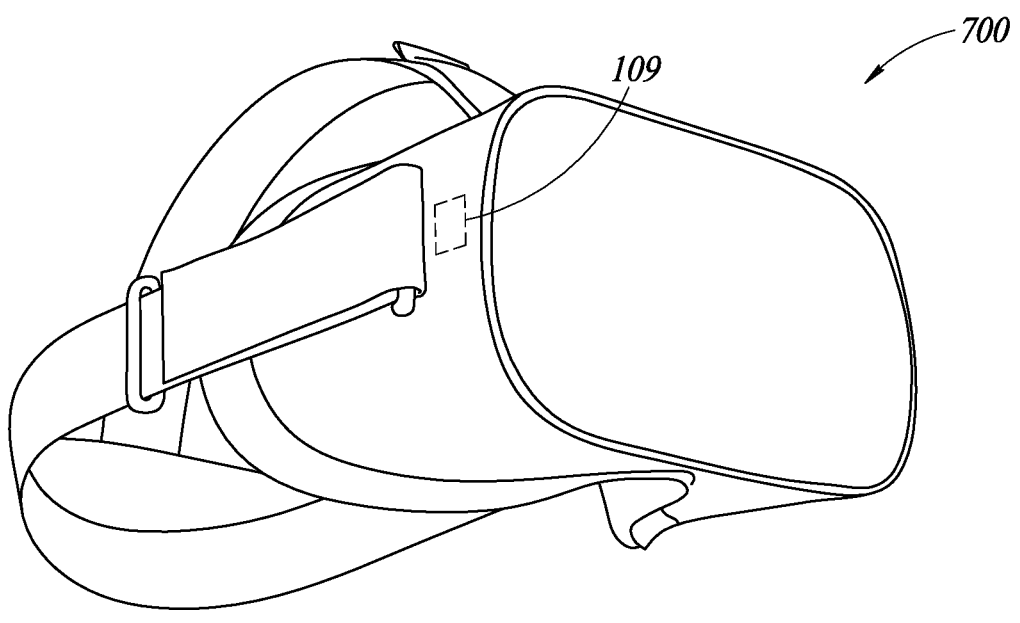
FIG. 7 is an illustration of a virtual reality headset including a sensor module, according to one embodiment.

FIG. 7 is an illustration of a VR headset 700, according to one embodiment. The VR headset 700 is one example of an electronic device 100 of FIG. 1. The VR headset 700 includes a sensor module 109. The sensor module 109 includes the gyroscope 104, the magnetometer 102, the magnetometer calibration module 106, and a sensor processor 108 described in relation to FIG. 1. When calibration of the magnetometer 102 is to be performed, the VR headset 700 may prompt a user to make some small motions with the head. The VR headset 700 may perform calibration as described previously based on gyroscope and magnetometer sensor signals generated during the prescribed motion. The prescribed motion is small compared to traditional methods due to the effectiveness of the calibration process as described herein. In some cases, the VR headset 700 may perform calibration without requesting any movement at all. After calibration has been performed, the sensor processor 108 can calculate the heading orientation of the VR headset 700 based on the magnetometer and gyroscope sensor signals.

FIG. 8 is a flow diagram of a method 800 for operating an electronic device, according to one embodiment. At 802, the method 800 includes generating gyroscope sensor signals with a gyroscope of an electronic device. At 804, the method 800 includes generating magnetometer sensor signals with a magnetometer of the electronic device. At 806, the method 800 includes estimating a first magnetometer calibration parameter by performing a Kalman filter process with the gyroscope sensor signals and the magnetometer sensor signals. At 808, the method 800 includes estimating a second magnetometer calibration parameter by performing a least squares process with the gyroscope sensor signals and the magnetometer sensor signals. At 810, the method 800 includes validating the first and second magnetometer calibration parameters by analyzing a convergence between the first magnetometer calibration parameter and the second magnetometer calibration parameter.

FIG. 9 is a flow diagram of a method 900 for operating an electronic device, according to one embodiment. At 902, the method 900 includes generating a first magnetometer calibration parameter by performing a Kalman filter process on gyroscope sensor signals and magnetometer sensor signals. At 904, the method 900 includes generating a second magnetometer calibration parameter by performing a least squares process with the gyroscope sensor signals and the magnetometer sensor signals. At 906, the method 906 includes validating the first and second magnetometer calibration parameters by comparing the first and second magnetometer calibration parameters. At 908, the method 900 includes determining an orientation of the electronic device based on the magnetometer sensor signals and combination of first and second magnetometer calibration parameters.

In one embodiment, a method includes generating gyroscope sensor signals with a gyroscope of an electronic device, generating magnetometer sensor signals with a magnetometer of the electronic device, and estimating a first magnetometer calibration parameter by performing a Kalman filter process with the gyroscope sensor signals and the magnetometer sensor signals. The method includes estimating a second magnetometer calibration parameter by performing a least squares process with the gyroscope sensor signals and the magnetometer sensor signals and validating the first and second magnetometer calibration parameters by analyzing a convergence between the first magnetometer calibration parameter and the second magnetometer calibration parameter.

In one embodiment, an electronic device includes a gyroscope configured to output gyroscope sensor signals, a magnetometer configured to output magnetometer sensor signals, and a magnetometer calibration module. The magnetometer calibration module is configured to receive the gyroscope sensor signals and the magnetometer sensor signals and to generate a first magnetometer calibration parameter with a Kalman filter process with the gyroscope sensor signals and the magnetometer sensor signals. The magnetometer calibration module is configured to generate a second magnetometer calibration parameter based on a least squares error reduction process with the gyroscope sensor signals and the magnetometer sensor signals.

In one embodiment, a method includes generating a first magnetometer calibration parameter by performing a Kalman filter process on gyroscope sensor signals and magnetometer sensor signals and generating a second magnetometer calibration parameter by performing a least squares process with the gyroscope sensor signals and the magnetometer sensor signals. The method includes validating the first and second magnetometer calibration parameters by comparing the first and second magnetometer calibration parameters. The method includes determining an orientation of the electronic device based on the magnetometer sensor signals and combination the first and second magnetometer calibration parameters.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   generating gyroscope sensor signals with a gyroscope of an electronic device;
   generating magnetometer sensor signals with a magnetometer of the electronic device;
   estimating a first magnetometer calibration parameter by performing a first analysis process with the gyroscope sensor signals and the magnetometer sensor signals;
   estimating a second magnetometer calibration parameter by performing a second analysis process different than the first analysis process with the gyroscope sensor signals and the magnetometer sensor signals;
   validating the first and second magnetometer calibration parameters by analyzing a convergence between the first magnetometer calibration parameter and the second magnetometer calibration parameter; and
   simultaneously operating multiple instances of the first analysis process and the second analysis process, wherein the multiple instances of the first analysis process are offset from each other in time, wherein simultaneously operating multiple instances of the first analysis process includes continuously calibrating the magnetometer.

2. The method of claim 1, wherein estimating the first magnetometer calibration parameter includes determining a hard iron offset.

3. The method of claim 2, wherein estimating the hard iron offset includes minimizing an error constraint on a total magnetic field based, in part, on the gyroscope sensor signals.

4. The method of claim 1, wherein estimating the second magnetometer calibration includes determining a hard iron offset.

5. The method of claim 4, wherein estimating the hard iron offset includes minimizing an error between a first derivative of magnetic field and a gyroscope propagated magnetic field.

6. The method of claim 1, wherein validating the first and second magnetometer calibration parameters includes determining a difference between the first and second magnetometer calibration parameters.

7. The method of claim 1, wherein the first analysis process is a Kalman filter.

8. The method of claim 7, wherein the second analysis process is a least squares process.

9. The method of claim 8, wherein the multiple instances of the Kalman filter and the least squares process are offset from each other in time.

10. The method of claim 1, further comprising determining an orientation of the electronic device based on the first and second magnetometer calibration parameters.

11. An electronic device, comprising:

a gyroscope configured to output gyroscope sensor signals;

a magnetometer configured to output magnetometer sensor signals; and a magnetometer calibration module configured to receive the gyroscope sensor signals and the magnetometer sensor signals and to generate a first magnetometer calibration parameter with a first analysis process with the gyroscope sensor signals and the magnetometer sensor signals and to generate a second magnetometer calibration parameter based on a second analysis process different than the first analysis process with the gyroscope sensor signals and the magnetometer sensor signals, wherein the magnetometer calibration module is configured to simultaneously operate multiple instances of the first analysis process and the second analysis process to continuously calibrate the magnetometer, wherein the multiple instances of the first analysis process and the second analysis process are offset from each other in time.

12. The electronic device of claim 11, wherein the magnetometer calibration module is configured to validate the first and second magnetometer calibration parameters based on a convergence of the first magnetometer calibration parameter and the second magnetometer calibration parameter.

13. The electronic device of claim 12, further comprising a sensor processor configured to receive the at least one of the first and second magnetometer calibration parameters and to determine an orientation of the magnetometer based on at least one of the first and second magnetometer calibration parameters.

14. The electronic device of claim 11, wherein the magnetometer calibration module is configured to determine a first hard iron offset with the first analysis process.

15. The electronic device of claim 14, wherein the magnetometer calibration module is configured to determine a second hard iron offset with the second analysis process.

16. The electronic device of claim 15, wherein the first analysis process is a Kalman filter and the second analysis process is a least squares process.

17. The electronic device of claim 11, further comprising:

at least one memory configured to store software instructions; and at least one processor configured to execute the software instructions, wherein the magnetometer calibration module is a software module implemented by executing the software instructions with the at least one processor.

18. A method, comprising:

generating a first magnetometer calibration parameter by performing a first analysis process on gyroscope sensor signals and magnetometer sensor signals;

generating a second magnetometer calibration parameter by performing a second analysis process different than the first analysis process with the gyroscope sensor signals and the magnetometer sensor signals;

validating the first and second magnetometer calibration parameters by comparing the first and second magnetometer calibration parameters;

determining an orientation of the electronic device based on the magnetometer sensor signals and at least one of the first and second magnetometer calibration parameters; and continuously calibrate the magnetometer sensor by simultaneously operating multiple instances of the first analysis process and the second analysis process, wherein the multiple instances of the first analysis process and the second analysis process are offset from each other in time.

19. The method of claim 18, further comprising determining a heading of the electronic device based on the magnetometer sensor signals and at least one of the first and second magnetometer calibration parameters.

20. The method of claim 18, wherein the electronic device is a virtual reality headset or an augmented reality headset.

* * * * *